United States Patent [19]

Notenboom

[11] Patent Number: 4,955,066
[45] Date of Patent: Sep. 4, 1990

[54] COMPRESSING AND DECOMPRESSING TEXT FILES

[75] Inventor: Leo A. Notenboom, Woodinville, Wash.

[73] Assignee: Microsoft Corporation, Redmond, Wash.

[21] Appl. No.: 421,466

[22] Filed: Oct. 13, 1989

[51] Int. Cl.$^5$ .............................................. G06K 9/00
[52] U.S. Cl. ........................................ 382/56; 382/40; 358/261.1; 358/427
[58] Field of Search ................. 382/40, 56; 358/261.1, 358/427

[56] References Cited

U.S. PATENT DOCUMENTS 4,494,150  1/1985  Brickman et al. .................. 358/260
4,626,829  12/1986  Hauck ................................ 340/347

Primary Examiner—Leo H. Boudreau
Assistant Examiner—Daniel Santos
Attorney, Agent, or Firm—Seed and Berry

[57] ABSTRACT

A method of compressing a text file in digital form is disclosed. A full text file having characters formed into phrases is provided by an author. The characters are digitally represented by bytes. A first pass compression is sequentially followed by a second pass compression of the text which has previously been compressed. A third or fourth level compression is serially performed on the previously compressed text. For example, in a first pass, the text is run-length compressed. In a second pass, the compressed text is further compressed with key phrase compression. In a third pass, the compressed text is further compressed with Huffman compression. The compressed text is stored in a text file having a Huffman decode tree, a key phrase table, and a topic index. The data is decompressed in a single pass and provided one line at a time as an output. Sequential compressing of the text minimizes the storage space required for the file. Decompressing of the text is performed in a single pass. As a complete line is decompressed, it is output rapidly, providing full text to a user.

12 Claims, 4 Drawing Sheets

COMPRESSING AND DECOMPRESSING TEXT FILES

TECHNICAL FIELD

This invention is in the field of reducing the storage space required for a file and, more particularly, to a method of compressing and decompressing text files.

BACKGROUND OF THE INVENTION

Storing digital data in a minimum space is frequently desired. There are many methods of compressing data to minimize the memory required for storing the data. One technique termed "Huffman compression" replaces bytes in the data text with bits. In Huffman compression, the unique code of bits used for a byte is based on the frequency of that particular byte in relation to other bytes in the text. When the compressed text is accessed, it is decoded by a logic tree technique of sequentially stepping through the individual bits to locate the byte represented by the bit code. Compressing and decompressing files using the Huffman technique is well known. Huffman, David A., "A Method for the Construction of Minimum-Redundancy Codes," Proceedings of the I.R.E., September 1952. A second current method of compressing text is the replacing of runs of characters with a run flag, a character, and a run count.

Current digital data compressing techniques, including Huffman compression and others, provide a first level compression of the full-format text. Unfortunately, text compressed using Huffman and other compression techniques may still be prohibitively large for some applications. Further, present techniques for decompressing the compressed text are too slow to be used in some environments. For example, a user or program may require immediate access to a readable form of the text file and not be able to wait while decompression and assembly into a readable form occur. In such environments, computer memory and disk storage are sacrificed for speed in accessing full-format text rather than compressing the text.

SUMMARY OF THE INVENTION

It is therefore an object of this invention to provide a method of compressing text sequentially through repeated levels to minimize the storage space required.

It is another object of this invention to provide a method of rapidly decompressing text to its original, full-format form for display to a user.

It is a further object of the invention to store help files in a compressed data base.

These and other objects of the invention, as will be apparent herein, are accomplished by generating a compressed text file having phrases that are digitally represented by a unique code of bits. A full text file in standard digital format ready for display on a screen is provided. A first level compressed text file is generated from the full text file by replacing runs of identical characters with a code identifying the character and the run count. The first level compressed text file is then further compressed by replacing frequently occurring phrases in the first level of compressed text file with a key phrase flag and an index byte. A third level compressed text file is generated from the second level compressed text file by replacing bytes in the second level of compressed text file with a unique string of bits.

The full text file is sequentially and serially compressed through three levels. That is, the full text file is compressed using a first technique. The once compressed text file is further compressed using a second technique. The twice compressed text file is further compressed using a third technique. By sequentially and serially compressing the full text file, the space required for storing the file is significantly smaller than the memory required to store the full text file or for storing a once compressed file. The particular sequence selected for compressing the text achieves a minimum file size.

The file containing the compressed text also contains the tables and indices required to access and then decompress any selected portion of the text. The file includes a topic index sequentially identifying the location of the compressed text. Context strings and a context map are provided to facilitate access to the topic index. A key phrase table and Huffman decode tree are also stored in the compressed file.

Compressed text is decompressed in a single pass within the same file containing the compressed text. When the compressed text is accessed, decompression of each phrase is completed prior to continuing with the next phrase. The text is output immediately upon being decompressed. The compressed text is thus rapidly decompressed and provided to a user.

DETAILED DESCRIPTION OF THE INVENTION

Compressing of full text to minimize computer memory is frequently required. Text files for aiding the user in understanding the operation of programs running on a computer, called "help files," are often large and take up significant space on a floppy disk in full format. For example, Microsoft provides a large number of help files with each program sold, such as with MS BASIC ®, MS QUICKC ®, MS-WORD ®, or with other programs. Full-format text help files may fill a dozen or more floppy disks. If compressed according to this invention, they fill only a part of a single floppy disk. Identical copies of the compressed text help file are produced using mass production techniques and sold commercially. The user is provided with significantly more information on fewer disks. Further, the cost of producing many disks to store the full-text files is avoided.

Figure 1:
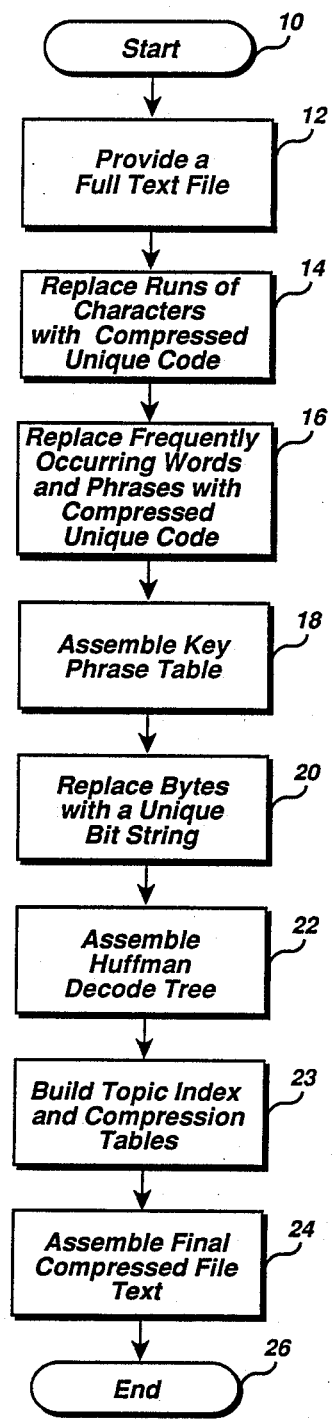
FIG. 1 is a flow chart of the sequence of compressing text.

As shown in FIG. 1, a full text file is sequentially compressed and assembled into a compressed text file for storage. After the start step 10 of the compression method, a full text file is provided, step 12. The full text file is compressed by a helpmake program. The helpmake program creates a compressed text file from a full ASCII-formatted text file, an RTF text-formatted file, or other well-known type of file to prepare for display on a computer monitor. Helpmake operates on the MS-DOS ® system to compress a user-supplied file upon request.

The helpmake program permits a user to select the amount of compression to take place. A user may indicate no compression of the particular file. A user may indicate run-length compression only. A user may indicate key phrase compression in addition to run-length compression. The user may then indicate extended key phrase compression sequentially following the key phrase compression. The user may select to perform Huffman compression either alone or in combination with other compression.

Mixing the types of compression used allows the file to be maximally compressed. The user may select to sequentially perform each of the four compression techniques. For example, the user may select to perform only the Huffman compression on full text which has not previously been compressed with a key phrase compression. Further, the user may elect to perform a run-length compression prior to performing the key phrase compression, followed sequentially by Huffman compression.

The flow chart of FIG. 1 is based on a user selecting to sequentially perform three compressions of the full text file: run-length compression, key phrase compression, and Huffman compression. The helpmake utility thus makes several passes on the data when encoding full text files into the compressed text format. In a first pass, extraneous encoding information is stripped from the file and remaining formatting information is converted to an internal form. For example, full text files often include data specific to the word processing program that created the file. An MS-WORD® file may indicate that the print style is Gothic, Roman, or the like. Because this type of information will not affect the display of the data, it is stripped from the file in a first compression step. Local context references and definitions are collected and resolved.

During a second pass, step 14, the text is run-length encoded. All runs of between 4 and 255 identical characters are replaced with a run-length flag, the character, and a repetition count. Frequently, help files contain long strings of spaces, underlines, hyphens, asterisks, and the like. The long strings of data are thus converted to three characters. In one embodiment, a generic run-length flag is provided for runs of any character, and the next byte is the repetition count and the next byte is the character. In another embodiment, frequently occurring runs, such as spaces, are provided with a unique flag followed by a repetition count, thus avoiding the need to provide the character and saving one byte in the compressed text. During step 14, the desired context strings located within the help file are collected.

In step 16, key phrase compression occurs by replacing frequently occurring phrases in the once compressed text with a unique code. In the key phrase compression step, the entire text is analyzed for the frequency of occurrence of phrases. A phrase may be either a word or a group of words. All words occurring with sufficient frequency are replaced with a flag byte and an index byte. The flag byte indicates that a phrase has been replaced and the index byte provides a pointer to the address of the full digital representation of the phrase. The full text of the phrase is thus stored only once in the help file and index bytes pointing to it are positioned at the appropriate location in the compressed text file.

In step 16, all words are counted and the size of each word saved. The savings realized by compressing each word is calculated. The savings calculation is based on the number of occurrences of a phrase and the size of a phrase. The phrases for which the greatest savings is realized are replaced with a flag byte and an index byte. For example, the word "the" would generally occur with sufficient frequency to replace the three characters with two characters at all occurrences of the word "the." A large phrase, such as "construction," "press any key," or the like, may have fewer occurrences, but replacement with a flag byte and an index byte provides greater overall savings than the key phrase replacement of such words as "end" or "stop."

In one embodiment, the 1,024 key phrases that provide the greatest savings are selected and the remainder are not key phrase encoded. If too many phrases are key phrase encoded, the total help file may become larger, because the key phrase table having the full digital representation of the text is part of the compressed help file. In an alternative embodiment, the number of key phrases encoded is selected to provide the smallest possible final compressed file.

If extended key phrase compression is enabled, the key phrase is replaced, even though it is embedded within a different word that is not a key word. Normal key phrase compression of the word "the" in the following sentence:

The car went to the theater and then back to the house.

would replace the word "the" with a flag byte and an index byte. If the replacement is case sensitive, "The" does not match "the." If extended key phrase compression is enabled, the sentence is compressed as follows:

The car went to the theater and then back to the house.

The letters "the" embedded in the words "theater" and "then" are also replaced with a flag and an index byte, whereas they would not be compressed, assuming the words "theater" and "then" are not considered worth compressing on their own merits.

Extended key phrase compression provides significant savings because the key phrase table does not become larger merely because more index bytes point to the same phrase. The extended key phrase compression is performed after the key phrase table is built.

In one embodiment, there are eight different flags for key phrase replacement. Because the index byte is 8 bits, only 256 different key phrases can be uniquely identified by one group of index bytes. Each key phrase flag references a unique subtable in the key phrase table. Some key phrase flags (in one embodiment, four flags) indicate that a single space character follows the key phrase, and the other four indicate that a space does not follow the key phrase. A single space character occurring after a key phrase is a frequent occurrence and use of a unique flag for such a space significantly compresses the text. Thus, in the following sentence:

The car went to the theater and then back to the house.

four occurrences of the word "the" are replaced by a flag and an index byte. Two occurrences, of "the" which include the space are replaced by a slightly different flag, but the same index byte as the two occurrences that do not include the space. The word stored in the key phrase table and fully compressed text does not include the space, that being determined by the type of flag used.

In step 20, bytes in the twice-compressed text are replaced with a unique bit string, a compression technique termed "Huffman encoding." Huffman encoding is a well-known prior art technique as an individual compression step. However, the use of Huffman encoding sequentially following key phrase compression, which sequentially followed run-length compression, is not known in the art. In performing step 20 of Huffman encoding, the character frequency of the compressed text is analyzed. Generally, each character of the now twice compressed text file is represented by a single byte. According to Huffman compression principles, the frequency of occurrence of every character determines the bit code to be assigned to that character. The program examines the number of times each character occurs and assigns a bit code based on the frequency of occurrence. The unique bit code may include 3, 4, 5, or any number of bits, depending upon the frequency of the character. For example, extremely frequent characters may be replaced by 4 bits. Characters occurring with less frequency may be replaced by 10 or more bits. Thus, some characters may be replaced by more bits than the original 8-bit byte. However, because the most frequent characters are replaced with the fewest number of bits, significant savings in storage space are achieved.

A significant advantage of performing Huffman encoding on twice-compressed text is the increased character frequency over that which normally would occur in performing Huffman encoding on full text. If Huffman compression is performed on full text, single letters, such as "e" or "s," will likely be the most frequent characters. Thus, the single 8-bit byte being replaced represents only a single letter in one word and other letters in that word are also encoded. Using sequential compression techniques according to the invention, the byte being replaced may represent dozens or hundreds of characters. For example, in twice-compressed text, a run-length flag will likely be a frequent character. Further, a key phrase flag or index byte may be frequent characters. The Huffman encoding step 20 will therefore replace each flag byte with significantly fewer bits throughout the entire text, greatly compressing the entire text. Because the flag byte and index byte represent entire words or phrases, significant compression is achieved. A phrase which previously required 10 to 20 bytes of 8 bits each is represented by 4 or 5 bits in the final compressed text repeatedly throughout the text. Similar savings are realized by replacing the run-length flag with a Huffman compressed bit. Sequentially performing Huffman compression on previously compressed text thus provides a significant storage savings over that realizable in the prior art.

After the text is compressed using the Huffman encoding, a Huffman decode tree is assembled in step 22. The format of a Huffman decode tree is described later with respect to FIG. 3 and follows techniques known in the prior art. In step 23, the final actual help file is written. The help file includes the help file header, the topic index, the context string table, the context map, the key phrase table, and Huffman tree all written to the help file, followed by the compressed text, as shown in Table 1.

The help file ends in step 26, having completed the creation of a final compressed help file.

TABLE 1

| Header |
| --- |
| Topic Index |
| Context Strings Table |
| Context Map |
| Key phrase Table |
| Huffman Decode Tree |
| Compressed Text |
| File Table |

As shown in Table 1, a help file includes a header. The header identifies the help file and contains various data relating to the content of the file. For example, the header identifies the file as a help file. The header also identifies applications that may access the help file. A flag is set in the header to determine whether context string searches will be upper/lower case sensitive or case insensitive. The help file contains other information, such as a count of the number of entries in the topic index, the number of context strings, the display width for the text file when uncompressed, the name of the originally created help file, the size of the file, and a table of file positions for the other fields in the database, as listed in Table 1.

The topic index is a table of compressed text file positions for each topic contained in the help file. The order of topics listed in the topic index corresponds to the order of text stored in the compressed text file. The memory storage address at the beginning of the compressed text file for each topic is stored in the topic index. Because the order of the topic index corresponds to the order of topics within the compressed text file, the size in bytes of any compressed topic within the help file can be determined by the difference between two successive topic file addresses. To retrieve data on a specific topic from the compressed topic file, the beginning address of the topic of interest need only be stored. The beginning address of the next topic of interest indicates the ending address for the prior topic, permitting the block of text corresponding to the topic of interest to be read from the disk into computer memory.

The context strings are an array of strings which map to the context numbers in the context map. These strings permit topic lookup from text by a user. The context map is a mapping of context numbers to topic numbers. The key phrase table is a table of strings extracted from the full text and represented by key phrase flags and indices in the compressed text. The Huffman decode tree is the tree used to decompress the Huffman compressed text. The compressed topic text is the actual compressed topic data. Each block of topic data is preceded by a one-word count of the number of bytes in the uncompressed topic file.

The entire help file is stored in the compressed form in memory, such as on a floppy disk, a hard drive, or the resident computer memory. Because the files are compressed, a large amount of text is storable on a single floppy disk. The help files may be concatenated together to form a single help file if desired. The concatenated help files may be treated as a single help file in many respects. Because compressing the text may require significant time, the compressed file is generated when time is not important but disk space is important. Decompressing text according to the invention rapidly provides the full text to a user.

Figure 2A:
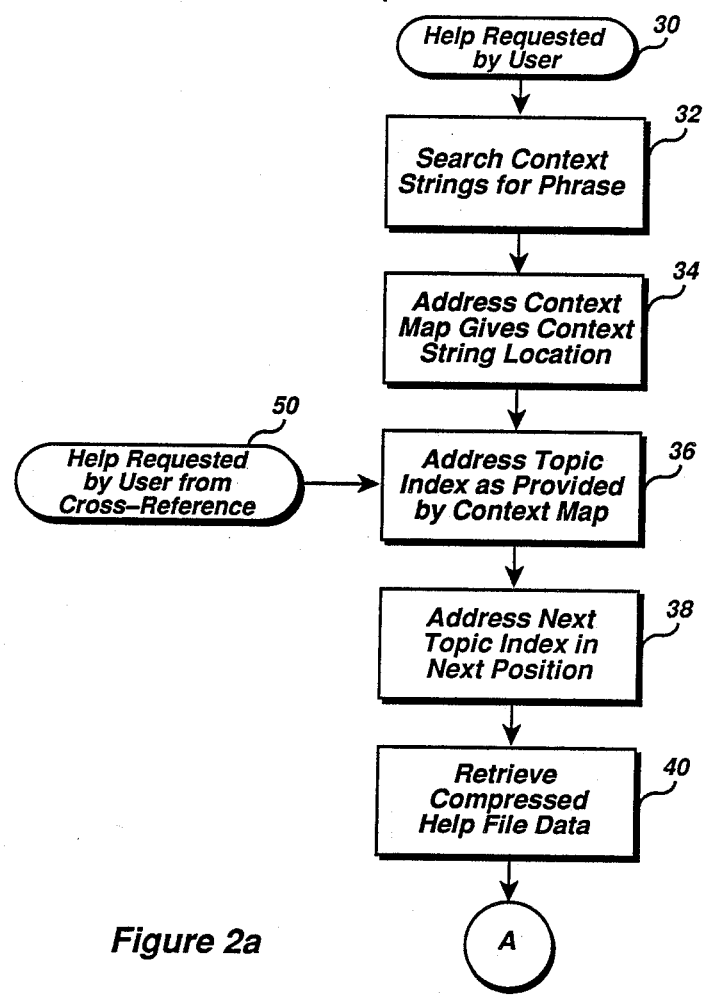
FIGS. 2a and 2b are a flow chart of retrieving, decompressing and outputting the compressed text.
Figure 2B:
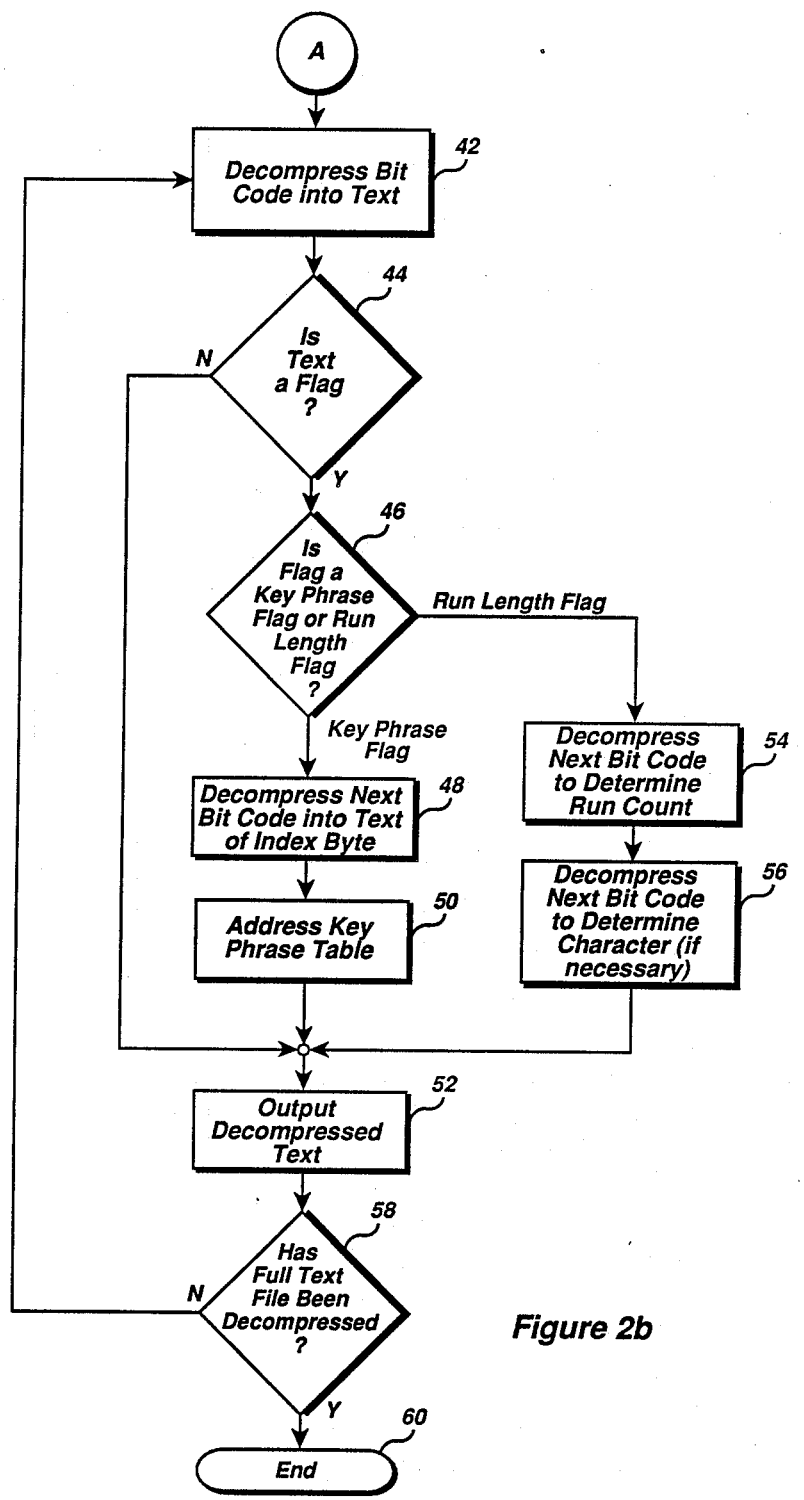

FIGS. 2a and 2b are a flow chart describing how a desired block of text is located in the compressed text file and decompressed. A user may request help in step 30 by many different techniques. In one embodiment, a user merely places the cursor on a word of interest to him and clicks on the mouse or presses a function key. Clicking on the word creates an instant hot spot which begins running of the help program of FIG. 2. The word in which the cursor resided when help function call was made is the word used to begin the context search for help on topics related to that word. Alternatively, a user may enter a formal help request by typing the word "help" and then typing or otherwise entering a topic on which he desires help. For example, a user may request help on a topic such as printing by clicking on the words "print, printer, printing, type," or the like.

When help is requested by user, the application program turns operation over to the help program to locate the requested text. The help program begins searching for a string corresponding to the phrase on which help was requested in step 32. The help retrieve program steps through the context strings portion of the help file as shown in Table 1. If there is a match in the context string of the help file with the phrase string on which help was requested, the program searches the context map, step 34. For example, assuming a user wishes to receive help on various print commands, he may ask for help using any one of many different key words, such as "print," "printing", "type," "printer," or the like. If no context string is found matching the string on which information was requested, the help program may search another help file looking for the context string or, alternatively, return a signal to the application program from which the help requestor originated that help is not available on the requested topic.

If a string is located in the context strings portion of the file, step 34 is carried out in the context map located within the same help file. The position of the context string within the context string table corresponds to the related position in the context map. For example, if searching for help on the phrase "print" and the phrase "print" is found as the 20th phrase in the context strings table, then the program immediately addresses the 20th position in the context map. The context map provides a reference to the topic index. The position in the topic index having the address of the compressed text is given by the context map. For example, the context map provides the address of the seventh topic in the topic index for help related to a print question. A starting request of a different word, but related to the same topic, such as "type," may occupy the 35th position in the context strings table and thus provide a pointer to the 35th position of the context map. The context map 35th position references the same portion of the compressed help file by indicating that the topic in the seventh position of the topic index relates to the word "type." Similarly, other words related to the general topic of printing, while having slightly different spellings, are referenced through the context map to the same help topic in the topic index.

The sequence of topics in the topic index corresponds to the sequence of that block of compressed help file text. Thus, the compressed text file corresponding to the first topic in the topic index is stored at the beginning of the compressed text. The compressed text file corresponding to the second topic is stored second and the compressed text file stored in the nth position of the compressed text corresponds to the nth position of the topic in the topic index. The topic index need merely contain the address of the beginning of the compressed text file for that particular topic. The help program queries the next topic for the starting address of its file and thus is able to determine the size of the file, its beginning and ending address locations, and other information necessary to retrieve the file. For example, if compressed text in the seventh position is being retrieved, the seventh position of the topic index contains the address of the start of that topic data and the eights position contains the address for the start of the next topic. The help program examines the addresses for the seventh and eight topics and thus is able to locate both the beginning and end of the seventh compressed text file, know its exact size, allocate the necessary computer memory for decompressing the text, and retrieve it to perform step 40.

The program decompresses and outputs the full text in steps 42-56. When a bit code is decompressed, it is identified as either full character text or a flag in step 44. If it is full character text, the text is output as decompressed text. If the text is a flag, step 46 determines the type of flag. If it is a key phrase flag, the next bit code is decompressed and used as an index byte in step 50 to locate the key phrase. The key phrase is then output in step 52. If the flag is a run flag of an arbitrary character, the next bit code is decompressed and saved as the repetition count in step 54. The next bit code is decompressed in step 56 as the character and then output the number of the count from step 54. If the flag indicates a run of spaces or some special flag, the next bit code is decompressed for the repetition count and the character is output the repetition count. The program then checks in step 46 to ensure that the entire compressed text file has been retrieved, decompressed, and provided as an output, and if so, enters ending step 48.

Figure 3:
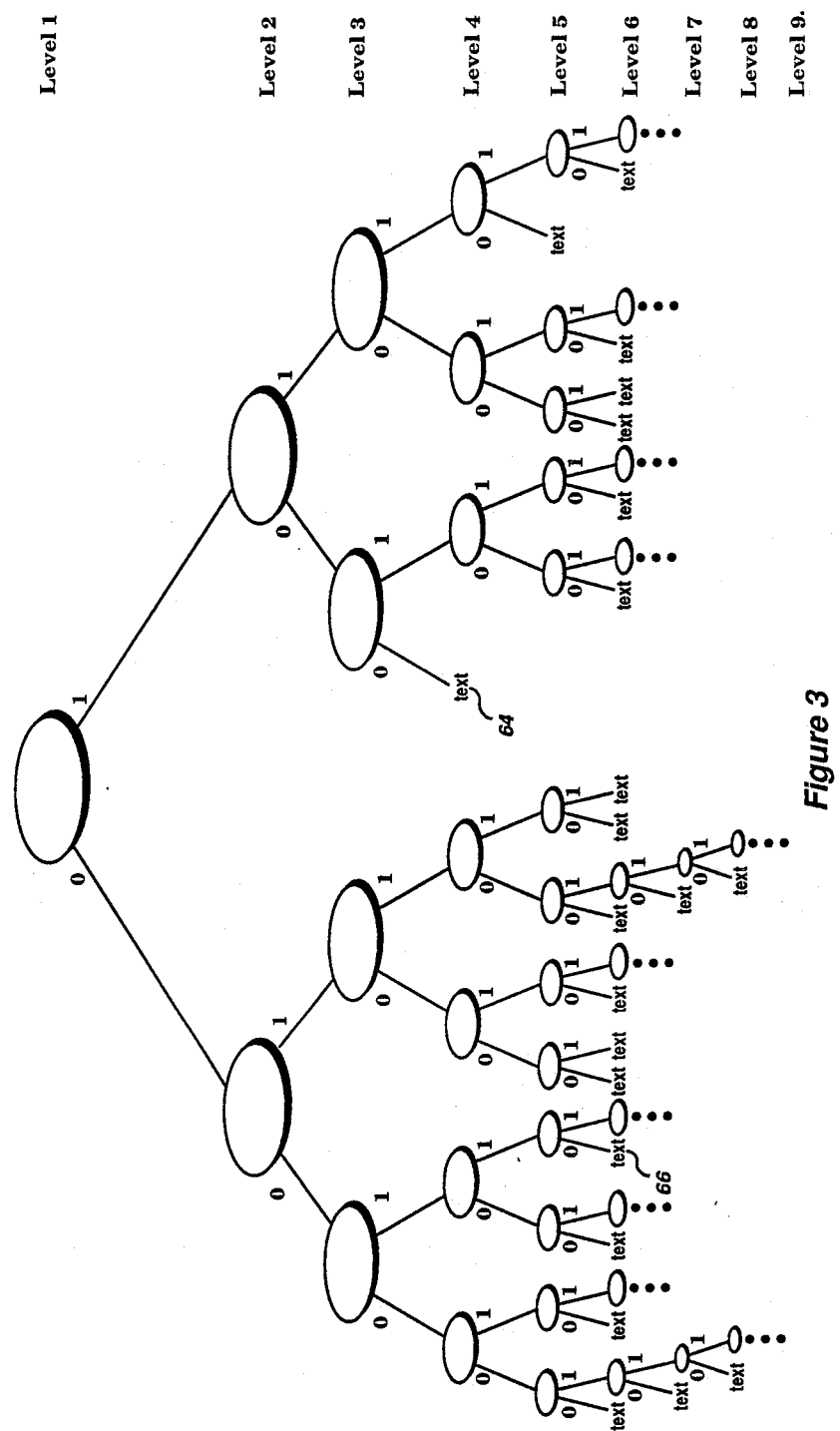
FIG. 3 is a logic tree describing the decompressing of text.

FIG. 3 illustrates a logic tree for decompressing Huffman compressed text. The use of a logic tree to decompress Huffman compressed text is known in the prior art. FIG. 3 illustrates one technique of following a logic tree which has been found useful in decompressing text according to the invention. The number of bits in the Huffman compressed text generally corresponds to the frequency of that text in the file. In the compressed Huffman table, the text 50 is represented in Huffman code as 100. The compressed text file provides the code 100 to the decompression program. The decompressing begins by stepping down the logic tree of FIG. 3 and, because the first digit in the code is a 1, going to the right-hand side of the node at level 1. The next bit in the compressed code is a 0, therefore the node to the left is selected, the 0 node. The next bit is also a 0, and then the uniquely coded bits describing the text 50 end in a terminal node. At the terminal node, sometimes called a "leaf" in the decoding tree, the actual digital text 64 is stored. Thus, the text is provided as an output upon reaching the terminus of the uniquely provided bit code.

As a second example, assume the uniquely provided bit code is "00110," five bits. The unique code 00110 is provided to the decompressing program for stepping down the logic tree of FIG. 3. The left node of the tree is selected because the first bit is 0. Similarly, the left node is selected at the second position, the right node is selected at the third and fourth positions. The left node, corresponding to a 0 for the fifth bit, is selected at the fifth position. At the left node, the decode tree of FIG. 3 terminates, indicating that the text 66 is stored at the terminus of this node. The digital data corresponding to the text 52 is thus returned.

As each block of text, generally in bytes, is returned from the decode tree, it is further decoded, if necessary, to assemble the original text, now fully decompressed text, as previously described. The text material may be output to an application program for a display to the user, for storing in an allocated memory slot, for printing of a hard copy, or for other selected use. Because the topic index provides the size of the original, uncompressed file, the appropriate memory space can be allocated for storing the help file as it is decompressed. After the text has been output, the decompressing program checks in step 46 to determine if the entire selected topic file has been decompressed. If not, the program returns to step 42 to continue to decompress the text as has been described. When the entire compressed text file has been decompressed and output, the program ends in step 48 and returns control to the application program.

Each line of the decompressed topic text is formatted as follows:

| cb Text | ASCII Text | cb Info | Attribute Info | Offh | Cross-reference Info |
|---------|------------|---------|----------------|------|----------------------|

The cbText provides the length, in bytes, of the ASCII decompressed text which follows within the line. The ASCII Text is the text of the decoded line. Generally, all characters contained in the ASCII text file are displayable. They are provided in any standard format for display available in the industry. The cbInfo provides the length, in bytes, of the Attribute and Cross-reference information which follows. The Attribute Info provides attribute information associated with the display of the preceding line. The attributes may include such features as bold, italics, a particular color, a background color, or the like. The attributes are associated with the way the text is displayed. The Offh indicates the end of the attribute file. The Cross-reference Info provides cross-referencing to additional topics in the help file for words within the single line. The Cross-reference Info may define hot spots contained within the line by indicating the starting column and ending column of a hot spot. The Cross-reference then includes an index number, or string, for referencing back to the help file for additional information related on related topics. If the related topic is within the same help file, the position in the topic index is provided as the cross-reference data. If the related topic is in a different help file, a context string or context map number and the name of the related help file may be provided. As the user reads the help text file, he may select any word within a single line and click on the word with his mouse to obtain cross-reference help on that particular word.

Generally, the cross-reference info is for strings not located in the context strings table. If a context string in the line is located in the context strings table, help on that phrase is obtainable according to the just explained techniques. However, if a phrase in the help file is not located within the context strings table, additional help data not otherwise available is obtainable by the cross-reference info.

The cross-reference info may be based on the particular text in the line of interest. For example, the word "disk" in a help file line describing printing to a disk may be cross-referenced to a help file on printing to a disk, whereas the word "disk" in a help file line discussing disk storage protocol may cross-reference to a help file on storage protocol.

The full-format help file is provided by an author, for a user. The author of the text file selects the context strings for which help will be provided in each section of his help file. The author also indicates which block of full, uncompressed text is related to the general topic for each context string he wishes stored in the context string table. The helpmake program uses this information to assemble the context strings table, context map, and the topic index. Cross-reference information is also provided by the author based on the context of the line of interest. Other background and display information relating to the full text file is provided by the author, as will be obvious to those in the art.

A method of compressing text using sequential compression passes in series has been described. A particular embodiment has been described for performing the method on a help file. The method of compressing and decompressing text as taught herein may be used on any text file, not just a help file, to advantageously store data in a minimum amount of space on a disk or in a computer memory.

I claim:

1. A method of compressing a text file stored in a computer memory in digital form, comprising:
   generating a full text file having characters formed into phrases, said characters being digitally represented by bytes;
   generating a first level compressed text file from said text full file by replacing runs of identical characters with a run flag, the character and a repetition count;
   generating a second level compressed text file from said first level compressed text file by replacing frequently occurring phrases in said first level compressed text file with a key phrase flag byte and an index byte; and
   generating a third level compressed text file from said second level compressed text file by replacing frequently occurring bytes in said second level compressed text file with a unique string of bits.

2. The method according to claim 1 further including:
   counting the number of occurrences of each phrase in said full text file;
   determining the storage saving achieved by replacing each occurrence of each different phrase with a flag byte and an index byte based on the number of occurrences of each said phrase and the size of each said phrase;
   replacing only those phrases with a flag byte and an index byte which provide significant space savings.

3. The method according to claim 2 wherein a threshold number of phrases that provide the most significant savings are replaced with a flag byte and an index byte.

4. The method according to claim 2 wherein a first flag is used to indicate a space after said phrase and a second flag is used, to indicate that there is not a space after said phrase.

5. The method according to claim 2 wherein said phrase forms only a portion of a word, and said portion of said word is represented by a flag byte and an index byte and the remainder of said word is represented by individual characters.

6. The method of locating and decompressing text stored in the memory of a computer comprising:
   comparing a sample string to a plurality of reference strings until a match is found;
   stepping to a topic address in memory based on which reference string matches said sample string;
   stepping to an address containing compressed text stored in memory based on an address provided by said topic address;
   retrieving compressed text from memory;
   decompressing said text from compressed form to a standard full format form ready for display on a computer monitor; and
   outputting said full format text.

7. The method according to claim 6 wherein each line of said full format text includes cross reference information from a string in said line to a different compressed text file which contains information related to said string.

8. The method according to claim 6 wherein said decompressing step includes the steps of:
   decompressing a portion of said compressed text;
   testing said decompressed portion to determine if it is in full format form;
   outputting said decompressed portion if it is in full format form, further decompressing said portion if it is not in full format form until it is in full format form and then outputting said further decompressed text.

9. The method according to claim 8 wherein said compressed text includes a unique bit code corresponding to each byte and some of said bytes correspond to a full format character and some of said bytes correspond to a flag byte which indicates that the next byte contains additional information to uniquely identify a group of characters from of said full format text.

10. The method according to claim 6 wherein said compressed text file is formed into a file containing compressed text, a Huffman decode tree, a key phrase table and an index to said compressed text.

11. The method according to claim 10 wherein said index includes a topic index, a context string table and a context map, said context map providing an address location reference of a context string within said topic index.

12. The method according to claim 10 wherein said step of testing said text to determine if it is in full format form includes determining whether said text is a standard character or a flag character.

* * * * *